(12) United States Patent
Watanabe et al.

(10) Patent No.: US 9,852,907 B2
(45) Date of Patent: Dec. 26, 2017

(54) MASK STRUCTURE FORMING METHOD AND FILM FORMING APPARATUS

(71) Applicant: TOKYO ELECTRON LIMITED, Tokyo (JP)

(72) Inventors: Masahisa Watanabe, Nirasaki (JP); Hiroshi Kubota, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/451,466

(22) Filed: Mar. 7, 2017

(65) Prior Publication Data

US 2017/0263455 A1 Sep. 14, 2017

(30) Foreign Application Priority Data

Mar. 9, 2016 (JP) .................. 2016-045989

(51) Int. Cl.
*H01L 21/033* (2006.01)
*H01L 21/02* (2006.01)
*H01L 21/311* (2006.01)
*C23C 16/52* (2006.01)
*C23C 16/46* (2006.01)
*C23C 16/455* (2006.01)

(52) U.S. Cl.
CPC .... *H01L 21/0337* (2013.01); *C23C 16/45557* (2013.01); *C23C 16/46* (2013.01); *C23C 16/52* (2013.01); *H01L 21/0217* (2013.01); *H01L 21/02142* (2013.01); *H01L 21/02167* (2013.01); *H01L 21/02271* (2013.01); *H01L 21/02321* (2013.01); *H01L 21/0332* (2013.01); *H01L 21/31144* (2013.01)

(58) Field of Classification Search
CPC .................. H01L 21/0337; H01L 21/02142
See application file for complete search history.

(56) References Cited

U.S. PATENT DOCUMENTS

| | | | | |
|---|---|---|---|---|
| 4,732,801 A | * | 3/1988 | Joshi | ................. H01L 21/32051 257/753 |
| 4,751,101 A | * | 6/1988 | Joshi | ...................... C23C 16/02 427/124 |
| 6,335,280 B1 | * | 1/2002 | van der Jeugd | .. H01L 21/28052 257/E21.17 |
| 2015/0125606 A1 | * | 5/2015 | Watanabe | .............. C23C 16/08 427/253 |

FOREIGN PATENT DOCUMENTS

JP    2015-110830 A    6/2015

* cited by examiner

*Primary Examiner* — Errol Fernandes
(74) *Attorney, Agent, or Firm* — Nath, Goldberg & Meyer; Jerald L. Meyer

(57) ABSTRACT

There is provided a method of forming an etching-purpose mask structure on an insulating film containing silicon and oxygen, which includes: forming an intermediate film containing silicon, carbon, nitrogen and hydrogen as main components by supplying a first process gas onto the insulating film formed on a substrate; and subsequently, forming a tungsten film by supplying a second process gas containing a compound of tungsten to the substrate to replace some of silicon constituting the intermediate film with tungsten.

7 Claims, 12 Drawing Sheets

Step S1

Step S2

MASK STRUCTURE FORMING METHOD AND FILM FORMING APPARATUS

CROSS-REFERENCE TO RELATED APPLICATION

This application claims the benefit of Japanese Patent Application No. 2016-045989, filed on Mar. 9, 2016, in the Japan Patent Office, the disclosure of which is incorporated herein in its entirety by reference.

TECHNICAL FIELD

The present disclosure relates to a method of forming a mask structure including a W (tungsten) film and a film forming apparatus of forming the mask structure.

BACKGROUND

For example, in a process of forming a capacitor of a DRAM (Dynamic Random Access Memory), it has been studied to form a comparatively deep recess in a $SiO_2$ (silicon oxide) film. To this end, it is required to laminate a mask film having high etching selectivity to the $SiO_2$ film on the $SiO_2$ film. That is to say, there is a demand for forming a mask film having a high etching resistance on the $SiO_2$ film when etching the $SiO_2$ film.

It has been studied to form a W film as the mask film. This W film can be formed, for example, by supplying a process gas to a silicon film and substituting silicon with W. However, the W film thus formed has low adhesion to the $SiO_2$ film. Thus, if the W film is directly laminated on the $SiO_2$ film, the W film may be peeled off. If the W film peels off in this way, the W film does not function as a mask film. This may collapse a pattern shape. A technique is known for forming a W film to suppress such peeling. However, there is a demand for a technique that more reliably suppresses the peeling of the W film.

SUMMARY

Some embodiments of the present disclosure provide a technique for, when a mask structure for use in etching an insulating film containing silicon and oxygen is formed on the insulating film, preventing peeling of a tungsten film that constitutes the mask structure.

According to one embodiment of the present disclosure, there is provided a method of forming an etching-purpose mask structure on an insulating film containing silicon and oxygen, which includes: forming an intermediate film containing silicon, carbon, nitrogen and hydrogen as main components by supplying a first process gas onto the insulating film formed on a substrate; and subsequently, forming a tungsten film by supplying a second process gas containing a compound of tungsten to the substrate to replace some of silicon constituting the intermediate film with tungsten.

According to another embodiment of the present disclosure, there is provided a film forming apparatus of performing a film forming process on a substrate placed in a vacuum container, which includes: a heating mechanism configured to heat the substrate placed in the vacuum container; a first gas supply part configured to supply a first process gas into the vacuum container to form an intermediate film containing silicon, carbon, nitrogen and hydrogen as main components on the substrate; a second gas supply part configured to supply a second process gas containing a compound of tungsten into the vacuum container; a pressure regulating part configured to regulate an internal pressure of the vacuum container; and a control part configured to control the heating mechanism, the first gas supply part, the second gas supply part and the pressure regulating part so as to perform a first step of forming the intermediate film by supplying the first process gas onto an insulating film formed on the substrate and subsequently, a second step of forming a tungsten film by supplying a process gas containing a compound of tungsten to replace some of silicon constituting the intermediate film with tungsten.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
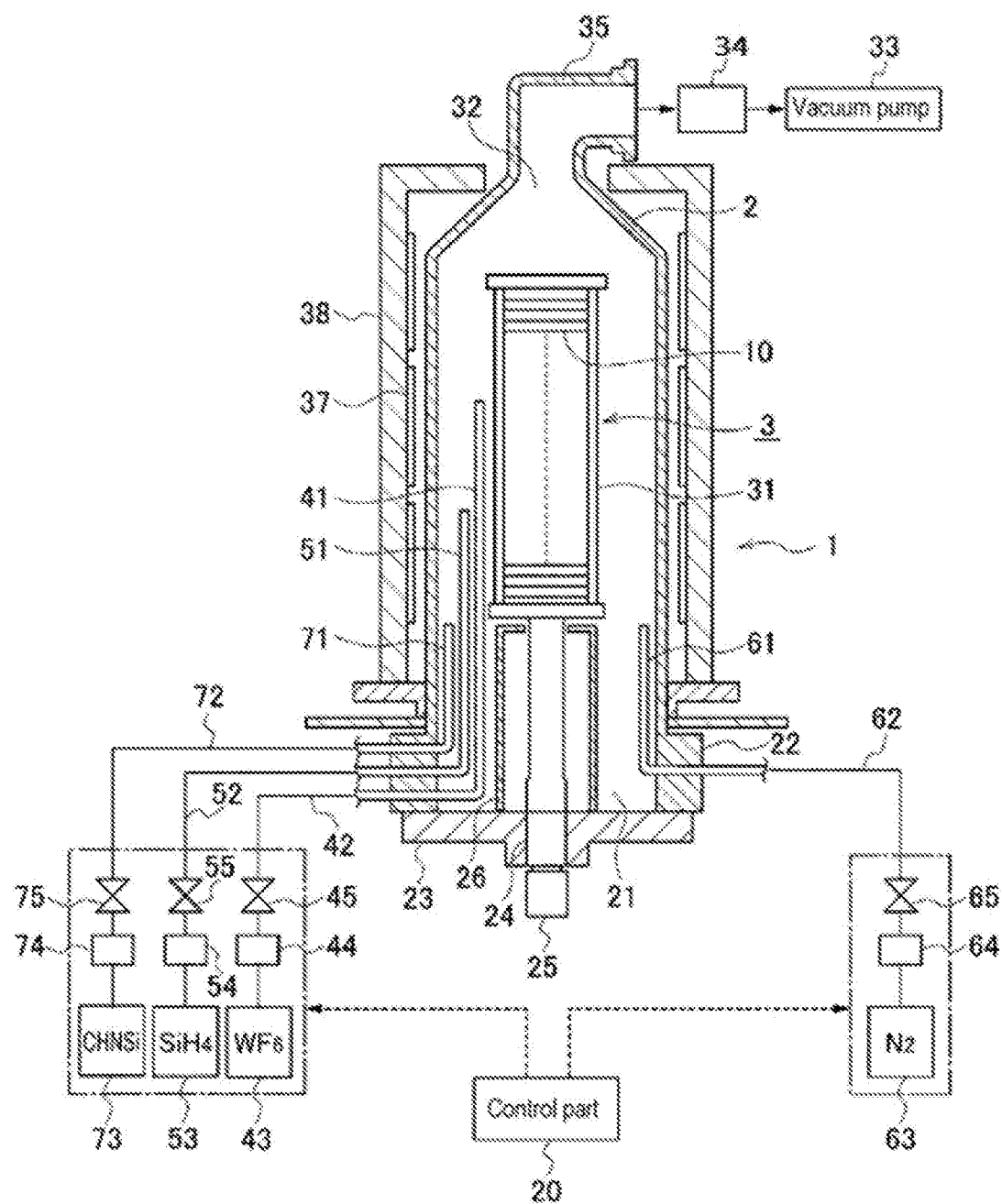
FIG. 1 is a schematic vertical sectional side view of a film forming apparatus for implementing a film forming method of the present disclosure.

A first embodiment of the present disclosure will be described with reference to the accompanying figures. FIG. 1 is a schematic vertical sectional view of a film forming apparatus 1. In FIG. 1, reference numeral 2 designates a vertical cylindrical reaction vessel formed of, for example, quartz. A lower end of the reaction vessel 2 is opened as a furnace opening 21. A flange 22 is integrally formed in a peripheral portion of the opening portion 21. A lid 23 made of, for example, quartz, and configured to air-tightly close the opening portion 21 by making contact with a lower surface of the flange 22 is provided below the reaction vessel 2 so as to be vertically opened and closed by a boat elevator (not shown). In the central portion of the lid 23, a rotary shaft 24 is provided so as to penetrate therethrough. A wafer boat 3 as a substrate holder is mounted in an upper end portion of the lid 23.

The wafer boat 3 is provided with three or more, for example, four, support columns 31. In order to hold a plurality of, for example, 125, semiconductor wafers (hereinafter referred to as wafers) 10 used as workpieces, in a shelf-like manner, grooves (slots) are formed in the support columns 31. A motor 25 serving as a drive unit for rotating the rotary shaft 24 is provided below the rotary shaft 24. The wafer boat 3 is rotated by the motor 25. Furthermore, a heat insulation unit 26 is provided on the lid 23 so as to surround the rotary shaft 24.

For example, L-shaped injectors 41, 51, 61 and 71 for supplying gases to the wafers 10 inside the reaction vessel 2 are inserted and installed in the flange 22 of the lower portion of the reaction vessel 2. A gas supply pipe 42 as a gas supply path is connected to a base end side of the injector 41. In the base end side of the gas supply pipe 42, a supply source 43 of a WF$_6$ (tungsten hexafluoride) gas as a second process gas for forming a W film, a mass flow controller 44 as a flow rate control part and a valve 45 are installed in the named order from a respective upstream side.

A gas supply pipe 52 as a gas supply path is connected to a base end side of the injector 51. In the base end side of the gas supply pipe 52, a supply source 53 of a SiH$_4$ (monosilane) gas, which is a third process gas for forming a silicon film, a mass flow controller 54 and a valve 55 are installed in the named order from a respective upstream side. A gas supply pipe 62 as a gas supply path is connected to a base end side of the injector 61. In the base end side of the gas supply pipe 62, a supply source 63 of a N$_2$ (nitrogen) gas, a mass flow controller 64 and a valve 65 are installed in the named order from a respective upstream side.

A gas supply pipe 72 as a gas supply path is connected to a base end side of the injector 71. In the base end side of the gas supply pipe 72, a supply source 73 of a first process gas, a mass flow controller 74 and a valve 75 are installed in the named order from a respective upstream side. Combinations of each of the injectors, each of the gas supply sources, each of the mass flow controllers, each of the valves and each of the gas supply paths constitute gas supply parts.

The first process gas supplied from the gas supply source 73 will be described in detail. The first process gas is a gas composed of diisopropylaminosilane (C$_6$H$_{17}$NSi) represented by the following chemical formula (1). The first process gas forms a SiCN film (intermediate film) described later. The diisopropylaminosilane is shown as CHNSi in FIG. 1. Hereinafter, in this specification, the diisopropylaminosilane will be referred to as CHNSi in some cases.

[Chemical formula (1)]

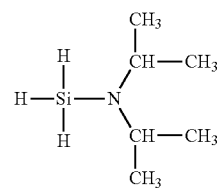

The configuration of the reaction vessel 2 will be further described. An exhaust port 32 for exhausting the interior of the reaction vessel 2 is formed in an upper portion of the reaction vessel 2. An exhaust pipe 35 in which a vacuum pump 33 capable of depressurizing and exhausting the interior of the reaction vessel 2 to a desired degree of vacuum and a pressure regulating part 34 is installed, is connected to the exhaust port 32. A heating furnace 38 including a heater 37 as a heating means for heating the interior of the reaction vessel 2 is installed around the reaction vessel 2.

Furthermore, the film forming apparatus 1 is provided with a control part 20 composed of a computer. The control part 20 has a function of starting up a process program, reading out a description item of a process recipe stored in a memory (not shown) and controlling a process condition based on the respective recipe. The control part 20 outputs control signals for controlling the heater 37, the pressure regulation part 34 and respective gas supply devices (the valves, the mass flow controllers, etc.) of each of the gas supply parts. Software including the process program and the process recipe (including screen data for inputting the process recipe) is stored in a storage medium, for example, a flexible disk, a compact disk, a magneto-optical disk (so-called MO), a memory card or the like. The software is installed in the control part 20.

Figure 2:
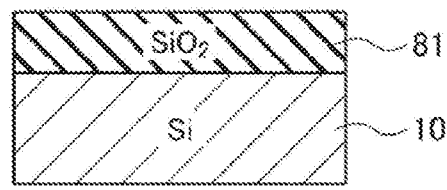
FIG. 2 is a vertical sectional side view showing a surface of a wafer under a film forming process according to a first embodiment.

Next, an example of a method for forming a mask structure to be carried out through the use of the above-described film forming apparatus 1 will be described with reference to the vertical sectional side views of films of the wafers 10 shown in FIGS. 2 to 7. A plurality of wafers 10 made of Si (silicon) is placed on the wafer boat 3 in a shelf shape. On the surface of each of the wafers 10, as shown in FIG. 2, a silicon oxide film (SiO$_2$ film) 81 which is an insulating film containing Si and O as main components is formed. An internal temperature of the reaction vessel 2 is controlled to, for example, 530 degrees C. An N$_2$ gas is supplied into the reaction vessel 2 so that an internal pressure of the reaction vessel 2 is controlled to be kept at atmospheric pressure. In this example, an internal set temperature of the reaction vessel 2 is maintained at 530 degrees C. during the process of the wafers 10. Then, by moving a boat elevator (not shown) upward, the wafer boat 3 is loaded into the reaction vessel 2.

Figure 3:
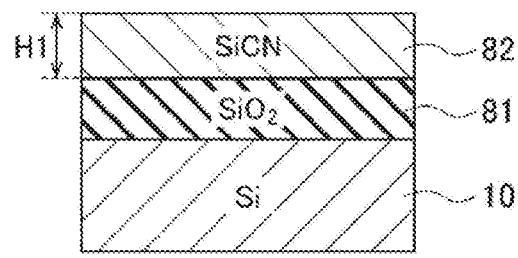
FIG. 3 is a vertical sectional side view showing the surface of the wafer under the film forming process.
Figure 4:
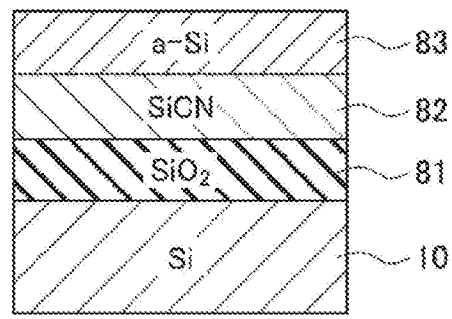
FIG. 4 is a vertical sectional side view showing the surface of the wafer under the film forming process.
Figure 5:
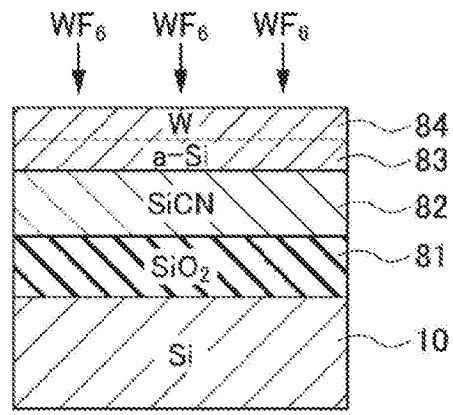
FIG. 5 is a vertical sectional side view showing the surface of the wafer under the film forming process.

After the opening portion 21 at the lower end of the reaction vessel 2 is closed by the lid 23, for example, the N$_2$ gas is supplied into the reaction vessel 2 and the interior of the reaction vessel 2 is exhausted. Thus, the internal pressure of the reaction vessel 2 is reduced to keep the interior of the reaction vessel 2 in a vacuum atmosphere of a predetermined pressure, for example, 60 Pa (0.45 Torr). If the wafers 10 are heated to the internal temperature of the reaction vessel 2, a diisopropylaminosilane (CHNSi) gas is supplied into the reaction vessel 2 (Step S1). The CHNSi gas thus supplied is decomposed due to the interior of the reaction vessel 2 being heated at a relatively high temperature. The decomposed product is deposited on the surface of each of the wafers 10. In other words, CVD (Chemical Vapor Deposition) using the CHNSi gas is performed. As a result, an intermediate film 82 containing Si (silicon), C (carbon), H (hydrogen) and N (nitrogen) as main components is formed on the $SiO_2$ film 81. The main components means that they are not the components serving as impurities, and means that they are contained at a rate of, for example, 10 atomic % or more. The intermediate film 82 has relatively high adhesion with respect to the $SiO_2$ film 81. In FIG. 3, the intermediate film 82 is represented as SiCN.

If the intermediate film 82 is too thin, pinholes may be generated and sufficient adhesion to the W film to be formed later may not be obtained. In order to prevent occurrence of such problems, a film forming process is performed so that a film thickness of the intermediate film 82 indicated by H1 in FIG. 3 becomes, for example, 5 nm or more. Then, if the intermediate film 82 having such a film thickness is formed, the supply of the CHNSi gas into the reaction vessel 2 is stopped, and the CHNSi gas remaining in the reaction vessel 2 is exhausted and removed. Subsequently, the $SiH_4$ gas is supplied into the reaction vessel 2. An amorphous silicon (a-Si) film 83 is laminated on the intermediate film 82 by the $SiH_4$ gas (step S2, FIG. 4).

When the a-Si film 83 is formed to have a predetermined film thickness, the supply of the $SiH_4$ gas into the reaction vessel 2 is stopped. The $SiH_4$ gas remaining in the reaction vessel 2 is exhausted and is removed from the reaction vessel 2. Subsequently, an $N_2$ gas is supplied into the reaction vessel 2. The internal pressure of the reaction vessel 2 is controlled to become, for example, 133 Pa (1.0 Torr). Thereafter, when the internal temperature of the reaction vessel 2 is stabilized, the supply of the $N_2$ gas is stopped, and a $WF_6$ gas is supplied into the reaction vessel 2 (step S3). The $WF_6$ gas reacts with the a-Si film 83 as shown in the following reaction formula 1. Thus, the replacement of the a-Si film 83 by a W film 84 proceeds (step S3, FIG. 5).

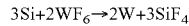

$$3Si+2WF_6 \rightarrow 2W+3SiF_4 \qquad \text{Reaction formula 1}$$

Silicon is contained in the W film formed by supplying the process gas containing a compound of tungsten to the silicon film in this manner. Therefore, more specifically, the W film is a film containing W as a main component. For the sake of convenience, in this specification, a film subjected to a process of supplying the process gas containing a compound of tungsten to the film containing silicon as a main component and replacing silicon with tungsten will be referred to as a W (tungsten) film.

Figure 6:
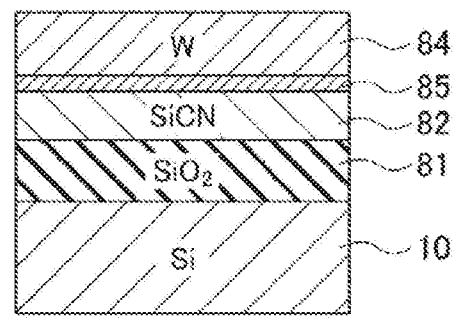
FIG. 6 is a vertical sectional side view showing the surface of the wafer under the film forming process.

The replacement of Si by W (tungsten) proceeds from a surface layer portion of the a-Si film 83 toward a lower portion thereof. If the lower portion of the a-Si film 83 is replaced, Si in a surface layer portion of the intermediate film (SiCN film) 82 is also replaced to W (FIG. 6). Replacement in the intermediate film 82 will be now described. As described above, the intermediate film 82 is formed by the CHNSi gas-based CVD. Unlike a SiN film (namely, a film not containing C as a main component) formed by CVD or ALD (Atomic Layer Deposition) using a DCS (dichlorosilane) gas and a $NH_3$ (ammonia) gas, or a HCD (hexachlorodisilane) gas and a $NH_3$ gas, the intermediate film 82 contains C (carbon) as a main component. Therefore, it is considered that the intermediate film 82 has higher reactivity with respect to a $WF_6$ gas than the SiN (silicon nitride) film not containing C as a main component. Accordingly, as described above, some of W in the surface layer portion of the intermediate film 82 are replaced by Si. In other words, the surface layer portion is integrated with the W film 84. That is to say, it is considered that the surface layer portion of the intermediate film 82 in which the replacement of Si by W has occurred has high adhesion to the W film 84. The surface layer portion is shown as an adhesion layer 85 in FIG. 6. As shown in an evaluation test to be described later, Si, W, C, N and H are mainly contained in the adhesion layer 85. The wafer 10 having the W film formed in this way constitutes a mask structure.

After the formation of the adhesion layer 85, the supply of the $WF_6$ gas is stopped. The $WF_6$ gas existing in the reaction vessel 2 is exhausted and removed from the interior of the reaction vessel 2. Subsequently, a $N_2$ gas is supplied into the reaction vessel 2 to additionally remove the $WF_6$ gas from the interior of the reaction vessel 2. If the internal pressure of the reaction vessel 2 is increased up to atmospheric pressure by the pressure regulation part 34, the boat elevator is moved down to unload the wafer boat 3 from the interior of the reaction vessel 2.

Figure 7:
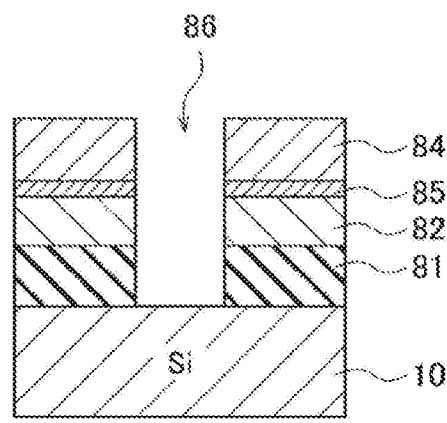
FIG. 7 is a vertical sectional side view showing the surface of the wafer after the film forming process.

A process performed with respect to the wafers 10 after processing the wafers 10 with the film forming apparatus 1 will also be described. First, a resist film is formed on the W film 84. Subsequently, exposure and development processes are performed so that the resist film is opened to form a pattern. Thereafter, the W film 84 and the adhesion layer 85 are etched along the pattern of the resist film by an etching gas composed of $Cl_2$ (chlorine), $CF_4$ (carbon tetrafluoride) or the like. After the pattern is formed, the resist film is removed. Thereafter, along the pattern thus formed, namely using the W film 84 as a mask, the intermediate film 82 and the $SiO_2$ film 81 are etched by an etching gas composed of $C_4F_6$ (hexafluorobutadiene), $C_4F_8$ (octafluorobutene) or the like, thereby forming a recess 86 (FIG. 7). For example, a capacitor that constitutes a DRAM is embedded in the recess 86.

In the film forming apparatus 1 described above, CVD using diisopropylaminosilane is performed to form the intermediate film 82 having high adhesion to the $SiO_2$ film 81 on the $SiO_2$ film 81 formed on the wafer 10. Thereafter, the a-Si film 83 is formed on the intermediate film 82. Then, the $WF_6$ gas is supplied to replace Si in the a-Si film 83 and some of Si in the intermediate film 82 by W, thereby forming the W Film 84 and the adhesion layer 85 for bringing the W film 84 into close contact with the intermediate film 82. Accordingly, it is possible to prevent the W film 84 from being peeled off from the $SiO_2$ film 81.

As the time for supplying the $WF_6$ gas in step S3 grows longer, Si at a lower portion of the intermediate film 82 is more easily replaced by W. In other words, the thickness of the adhesion layer 85 becomes larger. Unlike the W film 84, the adhesion layer 85 has relatively high adhesion to the $SiO_2$ film 81. Therefore, in FIG. 6, the replacement of Si by W in the intermediate film 82 is shown to stay only in a surface layer portion of intermediate film 82. However, the replacement of Si by W may occur even in a lower portion of the intermediate film 82. That is to say, the present disclosure is not limited to a case where only the surface layer portion of the intermediate film 82 becomes the adhesion layer 85. The $WF_6$ gas may be supplied so that the entire intermediate film 82 becomes the adhesion layer 85.

In step S2, the a-Si film 83 may be formed by supplying a $Si_2H_6$ (disilane) gas instead of the $SiH_4$ gas into the reaction vessel 2 kept at, for example, 400 degrees C. In this case, after forming the a-Si film 83, the internal temperature of the reaction vessel 2 is raised to a temperature suitable for performing the process of step S3, for example, 530 degrees C. In order to prevent migration of the a-Si film 83 during this temperature rise, a configuration may be employed in which a $H_2$ (hydrogen) gas is supplied into the reaction vessel 2. In forming the a-Si film 83, various elements such as O, C, N, B, P and Ge may be implanted as dopants. Furthermore, in step S2, instead of forming the a-Si film 83 as a silicon film, a polysilicon film may be formed by supplying a $SiH_4$ gas while keeping the internal temperature of the reaction vessel 2 relatively high.

In step S3, the gas for forming the W film 84 is not limited to the $WF_6$ gas. For example, a $WCl_6$ (tungsten hexachloride) gas may be used as the gas for forming the W film 84. Furthermore, the film to be etched by using the W film 84 as a mask is not limited to the $SiO_2$ film 81 but may be a film containing Si and O as main components. For example, the film to be etched may be a SiCOH film or a SiOC film.

In step S1, the process is performed by heating the wafers 10 to 530 degrees C. However, the wafers 10 may be heated to a temperature at which diisopropylaminosilane is thermally decomposed and at which the aforementioned intermediate film 82 is formed by CVD. For example, the heating temperature of the wafers 10 may be 450 degrees C. or higher. As shown in the below-described evaluation test, a deposition rate (a thickness of the film to be formed per unit time) becomes larger as the heating temperature grows higher. It is therefore preferable to perform the process of step S1 at a higher temperature.

In the diisopropylaminosilane, the bonding energy between Si and N, the bonding energy between N and C and the bonding energy between C and C are 3.13 eV, 2.99 eV and 3.12 eV, respectively. These bonding energies are lower than the bonding energy between Si and H and the bonding energy between C and H. Therefore, it is considered that the decomposed products resulting from the breakage of the Si—N bond, the C—C bond and the Si—N bond are deposited on the wafer 10, thereby forming the intermediate film 82. For example, when the Si—N bond is broken, diisopropylamine is formed as a decomposed product and is deposited on the wafer 10.

As described above, the intermediate film 82 is a film containing C, H, N and Si as main components. In step S1, a gas capable of forming such a film may be supplied. Therefore, the gas used in step S1 is not limited to the gas composed of diisopropylaminosilane. For example, if a gas containing C, H, N and Si just like diisopropylaminosilane and composed of a compound represented by the following chemical formula (2) is used instead of the diisopropylaminosilane gas, it is possible to form the intermediate film 82. $R_1$ to $R_5$ in chemical formula (2) are hydrogen or an arbitrary functional group. Any one of $R_1$ to $R_5$ is composed of carbon and hydrogen. Specific examples of compounds other than diisopropylaminosilane represented by chemical formula (2) include 3DMAS (trisdimethylaminosilane), BTBAS (bis(tertiary-butylamino)silane), and the like.

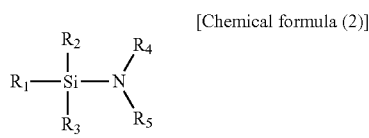

[Chemical formula (2)]

Furthermore, when forming the intermediate film 82, the present disclosure is not limited to supplying one kind of gas to the wafers 10. For example, CVD may be performed by supplying a gas composed of a compound represented by the following chemical formula (3) into the reaction vessel 2 together with a gas containing N such as ammonia gas or the like, thereby forming the intermediate film 82. Any one of $R_6$ to $R_9$ is a functional group composed of C and H. Examples of compounds corresponding to chemical formula (3) may include TEOS (tetraethoxysilane), diethylsilane, triethylsilane, 1,2-bis-silylethane, 1,4-disilabutane, and the like. Alternatively, three kinds of gases including Si, N and C may be supplied to form the intermediate film 82. Specifically, for example, a DCS (dichlorosilane) gas, a $NH_3$ gas and an ethylene gas may be supplied to form the intermediate film 82. However, if the film forming process is performed using the gas composed of the compound represented by the above chemical formula (2), there is an advantage in that it is possible to reduce the kinds of gases to be supplied into the reaction vessel 2 and to prevent the configuration of the film forming apparatus 1 from being complicated.

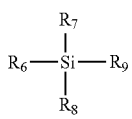

[Chemical formula (3)]

Meanwhile, if the surface layer portion of the intermediate film 82 is exposed to atmosphere during the time chart period from the formation of the intermediate film 82 in step S1 to the formation of the a-Si film 83 in step S3, Si in the surface layer portion is oxidized into a silicon oxide. As such, when steps S2 and S3 are performed, the W film 84 is formed on the silicon oxide. That is to say, the W film 84 is prone to be peeled off. In addition, if the surface layer portion of the a-Si film 83 is oxidized by being exposed to atmosphere after the a-Si film 83 is formed in step S2 and before the W film is formed in step S3, the formation of the W film 84 is hindered.

In order to prevent these problems, in the aforementioned process, the interior of the reaction vessel 2 is kept in a vacuum atmosphere from the start of step S1 (the start of the formation of the intermediate film 82) to the end of step S3 (the end of the formation of the W film). At this state, the process is carried out without unloading the wafers 10 from the reaction vessel 2. That is to say, steps S1 to S3 are performed in a state in which the surroundings of the wafers 10 are maintained in a vacuum atmosphere. By maintaining the vacuum atmosphere in this way, it becomes unnecessary to carry out a reduction process between the respective steps S, which makes it possible to prevent a decrease in the throughput. From the viewpoint of maintaining the vacuum atmosphere in steps S1 to S3, namely from the point of performing the processes of steps S1 to S3 with one film forming apparatus 1, the compound represented by the chemical formula (2) may be used in step S1 to prevent the apparatus configuration from becoming complicated.

Figure 8:
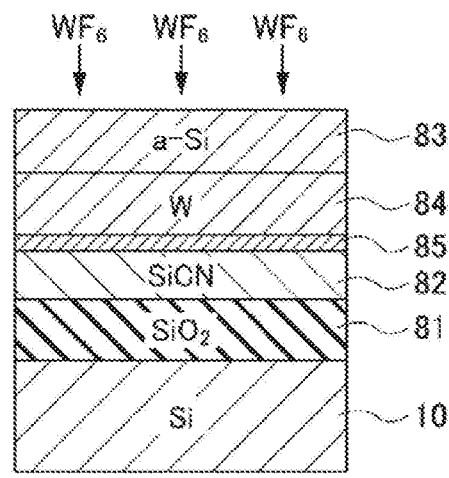
FIG. 8 is a vertical sectional side view showing the surface of the wafer under the film forming process.
Figure 9:
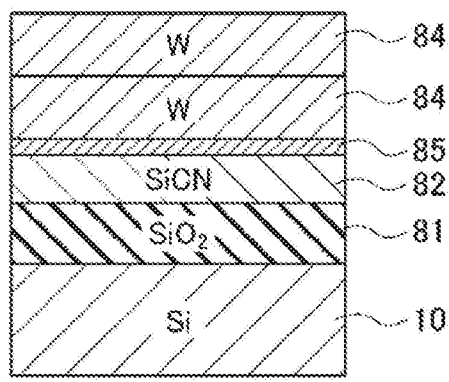
FIG. 9 is a vertical sectional side view showing the surface of the wafer under the film forming process.

After performing steps S1 to S3 to form the W film 84, step S2 may be performed again so that the $SiH_4$ gas is supplied to form the a-Si film 83 on the W film 84. Thereafter, step S3 may be performed again so that the $WF_6$ gas is supplied to replace the a-Si film 83 with the W film 84 (FIGS. 8 and 9). That is to say, steps S2 and S3 may be repeated to laminate the W films 84 one above another. The number of repetitions of steps S2 and S3 is not limited to two but may be three or more. By forming the W films 84 to have a laminated structure in this way, it is possible to suppress a film stress by reducing a film thickness of the W film 84 per layer. In the case of repeating steps S2 and S3 in this way, for the reasons mentioned above, the surroundings of the wafers 10 are kept in a vacuum atmosphere from the start of step S1 to the end of the final step S3 while steps S2 and S3 are repeated.

Second Embodiment

Figure 10:
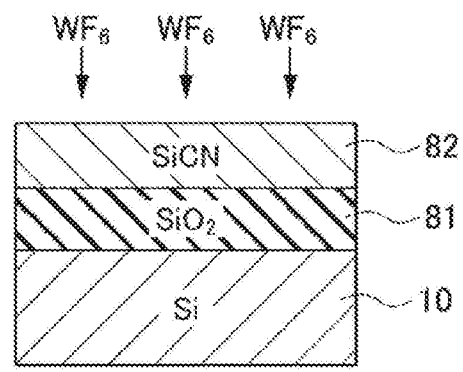
FIG. 10 is a vertical sectional side view showing a surface of a wafer under a film forming process according to a second embodiment.
Figure 11:
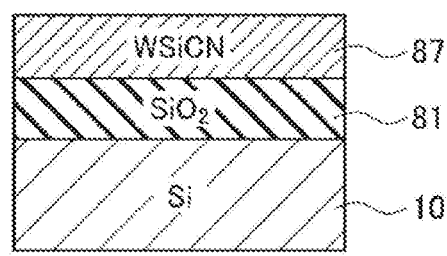
FIG. 11 is a vertical sectional side view showing the surface of the wafer under the film forming process.

A method of forming a mask structure according to a second embodiment will be described with a focus on the differences from the first embodiment. As described above, step S1 is performed to form an intermediate film 82. Then, step S3 is performed to supply a $WF_6$ gas while bypassing step S2 (FIG. 10). Some of Si constituting the intermediate film 82 are replaced by W, whereby a W film 87 is formed (FIG. 11). That is to say, the W film 87 is a film corresponding to the above-described adhesion layer 85 and containing W, Si, C, N and H as main components. In FIG. 11, the W film 87 is denoted as WSiCN in order to distinguish the W film 87 from the W film of the first embodiment.

Figure 12:
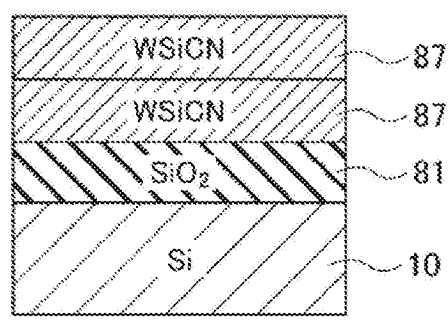
FIG. 12 is a vertical sectional side view showing the surface of the wafer under the film forming process.

For example, by repeating steps S1 and S3 a plurality of times, the W films 87 are laminated one above another. FIG. 12 shows an example in which steps S1 and S3 are repeated twice to laminate two layers of W films 87. However, such processes may be performed so that three or more layers of W films 87 are laminated. The replacement of Si by W reduces a film thickness of the W film 87. That is to say, the film thickness of the W film 87 is smaller than that of the intermediate film 82. As the film thickness of the intermediate film 82 is increased in order to obtain the desired film thickness of the W film 87, the roughness of the surface of the intermediate film 82, ultimately the W film 87 increases. Therefore, by laminating the W films 87 as described above, the total film thickness of the W films 87 can be increased while suppressing an increase in the roughness. Just like the W film 84, the W film 87 is used as an etching mask for the $SiO_2$ film 81. As described above, the adhesion of the W film 87 to the $SiO_2$ film 81 is relatively high. It is therefore possible to obtain the same effects as those of the first embodiment. However, the first embodiment is more preferred because the purity of W can be increased by suppressing the concentration of C and N in the W film and because the film quality of the W film as a mask can be increased.

Figure 13:
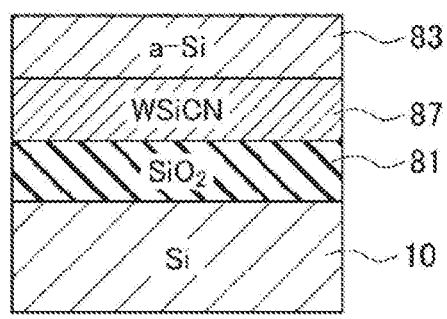
FIG. 13 is a vertical sectional side view showing the surface of the wafer under the film forming process.
Figure 14:
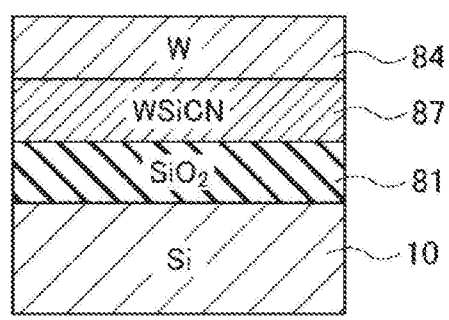
FIG. 14 is a vertical sectional side view showing the surface of the wafer under the film forming process.

After the W film 87 is formed in the second embodiment, the above-mentioned step S2 may be performed (FIG. 13) and, then, step S3 may be performed so that the W film 84 described in the first embodiment is formed on the W film 87 (FIG. 14). The technique described in the first embodiment may be applied to the second embodiment. Accordingly, for example, various gases described in the first embodiment may be used for forming the intermediate film 82.

[Evaluation Tests]

Evaluation tests related to the present disclosure will be described.

(Evaluation Test 1)

In evaluation test 1, CVD was performed by supplying a diisopropylaminosilane gas to the wafer 10 in the same manner as in step S1, thereby forming the intermediate film 82. Thereafter, a film composition of the intermediate film 82 was examined by Rutherford backscattering analysis (RBS). In comparative test 1, ALD was performed by alternately and repeatedly supplying a DCS gas and a $NH_3$ gas to the wafer 10 heated to 550 degrees C., thereby forming a SiN film. A film composition of the SiN film was examined by RBS in the same manner as in evaluation test 1. Table 1 below shows the results of evaluation test 1 and comparative test 1. In table 1, the unit of numbers is atomic %.

TABLE 1

|  | Si | H | O | N | C |
|---|---|---|---|---|---|
| Evaluation test 1 | 26.2 | 30.5 | 5.1 | 18.1 | 20.1 |
| Comparative test 1 | 48.0 | 1.5 | <1 | 50.3 | 0.2 |

As shown in Table 1, the intermediate film 82 formed in evaluation test 1 contains Si, H, N and C as main components. As compared with the SiN film of comparative test 1, the content of H and the content of C are high. Even when steps S2 and S3 described in the embodiments are performed with respect to the SiN film formed by ALD in the same manner as in comparative test 1, the replacement of Si by W hardly occurred on the surface layer portion of the SiN film. That is to say, it was confirmed that the adhesion layer 85 described in the embodiments was not formed. Accordingly, it is considered from the result of evaluation test 1 that Si is easily replaced by W in step S3 because the intermediate film 82 contains a large amount of C as described above. In evaluation test 1, it was confirmed that C was contained in an amount of about 20 atomic %. However, it is considered that the adhesion layer 85 can be formed as long as C is contained as a main component even if the content of C is smaller than the result of evaluation test 1. Specifically, it is considered that the concentration of C in the intermediate film 82 may preferably be, for example, 10 atomic % or more.

In the SiN film of comparative test 1, the content of N is slightly higher than the content of Si. In contrast, in the intermediate film 82 of evaluation test 1, the content of Si is larger than the content of N. The ratio of Si to N also seems to contribute to the property of the intermediate film 82 in that Si is relatively easily replaced by W. In other words, it is considered that in the composition of the intermediate film 82, the content of Si (atomic %) is preferably larger than the content of N (atomic %).

(Evaluation Test 2)

In evaluation test 2-1, the intermediate film 82 was formed by the aforementioned step S1 so that the film thickness becomes 7 nm. In this evaluation test 2-1, steps S2 and S3 were not performed. In addition, in evaluation test 2-2, steps S1 to S3 were performed as described in the first embodiment to form the intermediate film 82 and the W film 84. In evaluation test 2-3, as described in the second embodiment with reference to FIGS. 13 and 14, steps S1, S3, S2 and S3 were performed in the named order to form a laminated film of the W film 84 formed from the intermediate film 82 and the W film 87 formed from the a-Si film 83. In evaluation tests 2-1 to 2-3, step S1 was performed with respect to the wafer 10 on which the $SiO_2$ film 81 shown in FIG. 2 is formed. The wafers 10 of evaluation tests 2-1 to 2-3 were subjected to SIMS (secondary ion mass spectrometry).

Figure 15:
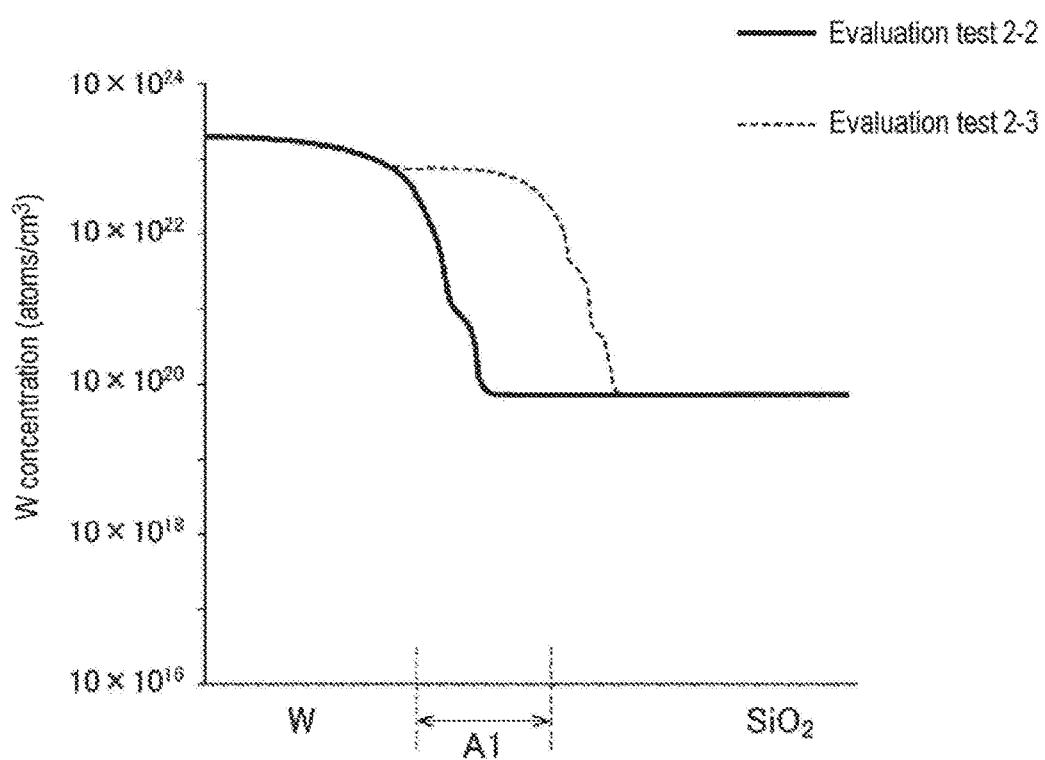
FIG. 15 is a graph showing the result of an evaluation test.

FIG. 15 is a graph showing the results for W among the detected components. The vertical axis in the graph indicates the concentration of W ($atoms/cm^3$). The horizontal axis in the graph indicates the depth from the surface of the wafer 10. The position in the wafer 10 grows deeper toward the right side. In the horizontal axis, A1 indicates a region where the intermediate film 82 is formed in step S1. Therefore, in evaluation test 2-3, the region A1 corresponds to a region where the W film 87 is formed. The region at the right side of the region A1 indicates a region where the $SiO_2$ film 81 is formed. The region on the left side of the region A1 indicates a region where the W film 84 is formed in evaluation tests 2-2 and 2-3.

The result obtained from evaluation test 2-2 is shown by a solid-line waveform, and the result obtained from evaluation test 2-3 is shown by a dotted-line waveform. In evaluation test 2-1, W was hardly detected. Thus, no waveform is shown. Referring to the waveform of evaluation test 2-2, the concentration of W is high at the left side within the region A1 of the horizontal axis of the graph, namely in the surface layer portion of the intermediate film 82. However, at the right side within the region A1 of the horizontal axis, namely in the lower portion of the intermediate film 82, the concentration of W is low, which is substantially equal to the concentration of W in the $SiO_2$ film 81. Accordingly, it was confirmed that as described in the first embodiment, Si in the surface layer portion of the intermediate film 82 is replaced by W.

Referring to the waveform of evaluation test 2-3, the concentration of W over the entire region A1 is equal to the concentration of W in the region where the W film 84 is formed. Therefore, it was confirmed that even in evaluation test 2-3, the replacement of Si by W occurs in the intermediate film 82. In addition, comparison of the waveforms of evaluation tests 2-2 and 2-3 reveals that, by supplying the $WF_6$ gas after forming the a-Si film 83 as in evaluation test 2-2, it is possible to reduce the depth at which Si is replaced by W in the intermediate film 82.

Figure 16:
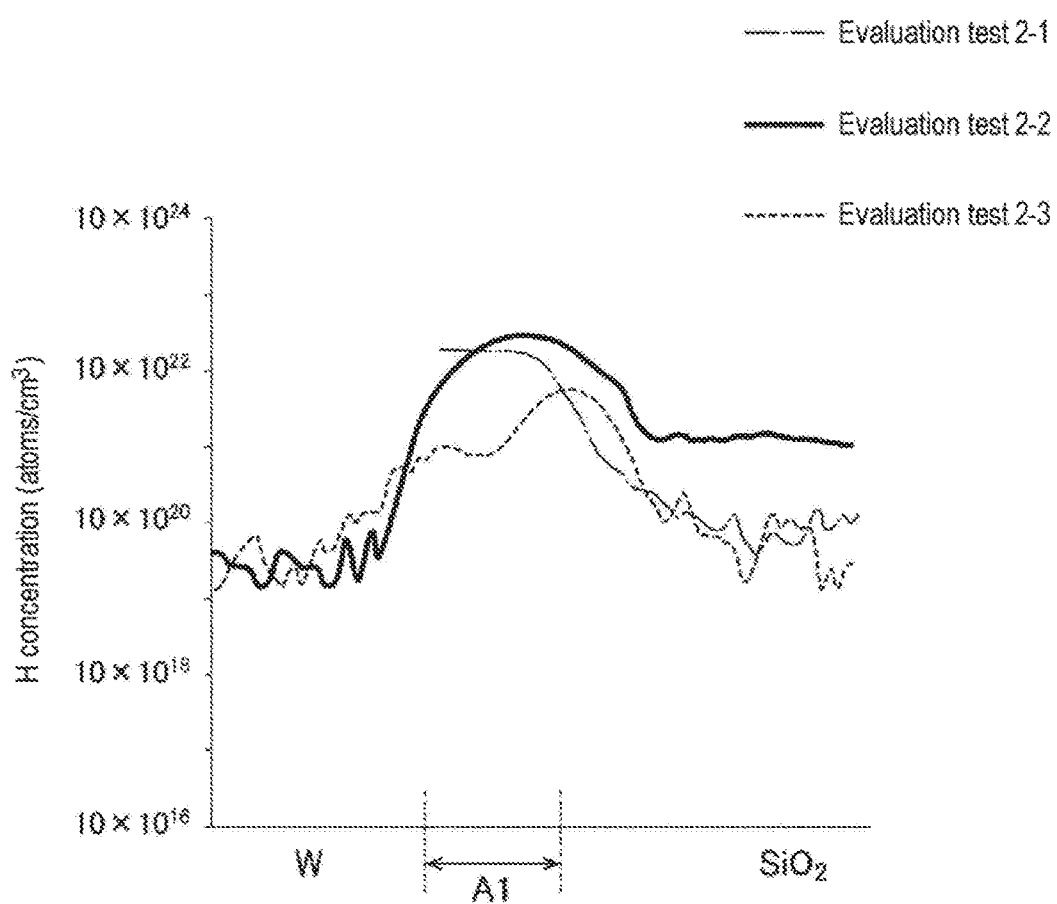
FIG. 16 is a graph showing the result of an evaluation test.

In this evaluation test 2, in addition to W, a graph of the concentrations of H, C, N, O and Si in the depth direction of the wafer 10 is acquired in the same manner as W. FIG. 16 is a graph showing the concentration of H in the same manner as in FIG. 15. The result of evaluation test 2-1 is shown as a chain-line waveform. Referring to this graph, at the left side in the region A1 of the horizontal axis (at the front side of the film), the concentration of H in evaluation test 2-3 is lower than that in evaluation tests 2-1 and 2-2. Presumably, this is because the $WF_6$ gas was supplied twice in evaluation test 2-3 and the reaction by the $WF_6$ gas progressed to a great extent.

Figure 17:
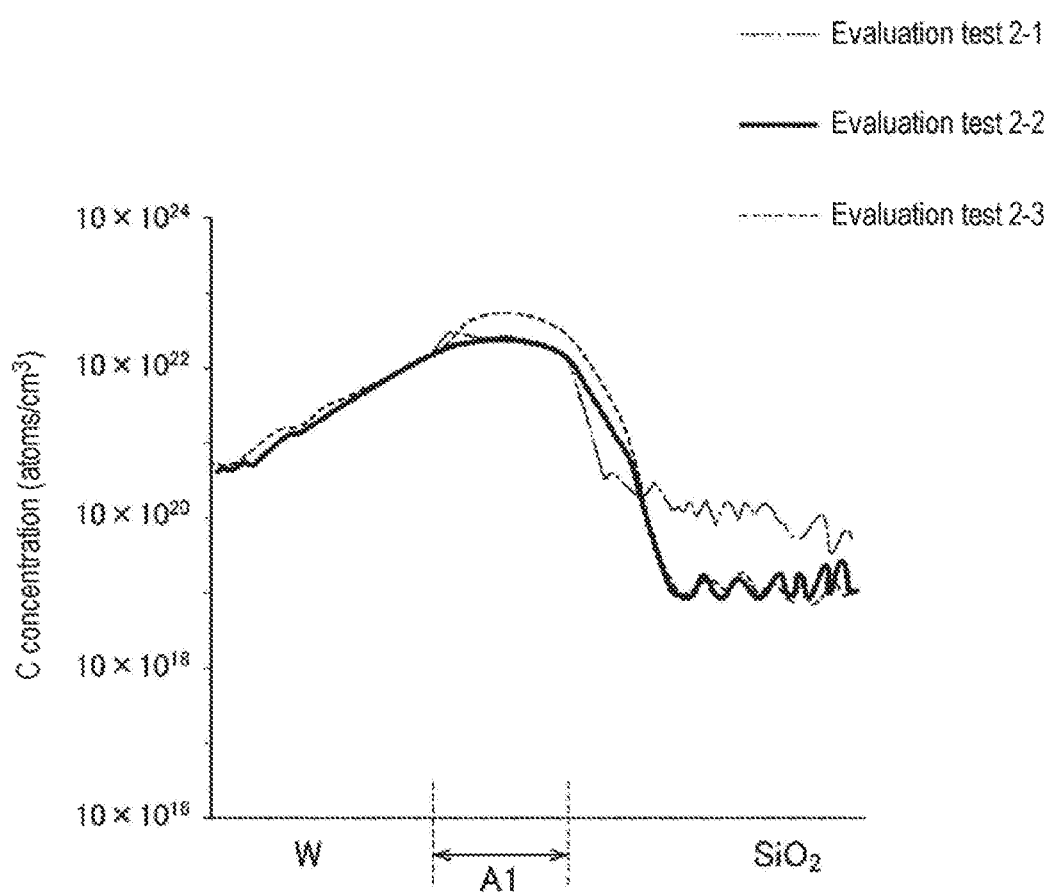
FIG. 17 is a graph showing the result of an evaluation test.

FIG. 17 is a graph showing the concentration of C in the same manner as in FIG. 16. From this graph, it was confirmed that C is contained in the intermediate film 82 in evaluation test 2-1, C is contained in the intermediate film 82 and the W film 84 in evaluation test 2-2, and C is contained in the W films 84 and 87 in evaluation test 2-3.

As for N, O and Si, the graphical representation is omitted and the test results are briefly explained. No significant difference in the waveforms of the graph is seen between evaluation tests 2-2 and 2-3. It was confirmed that N and Si are contained in the intermediate film 82 of evaluation test 2-2 and the W film 87 of evaluation test 2-3. As for 0, it was confirmed that in both of the intermediate film 82 of evaluation test 2-2 and the W film 87 of evaluation test 2-3, the content of O remains small at the upper side of the film and tends to increase toward the lower side of the film, namely toward the $SiO_2$ film 81.

(Evaluation Test 3)

Figure 18:
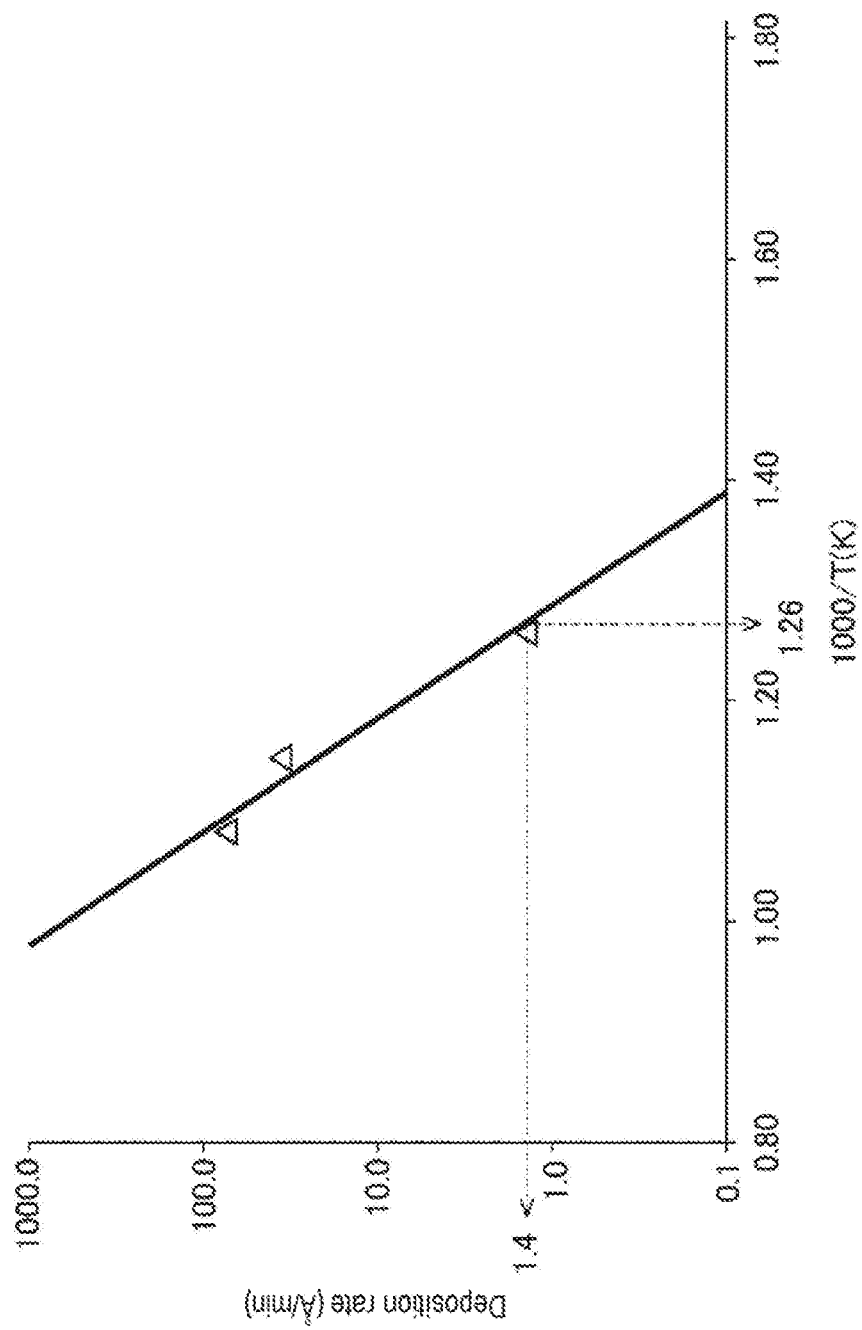
FIG. 18 is a graph showing the result of an evaluation test.

In evaluation test 3, the aforementioned step S1 was performed by changing the internal temperature of the reaction vessel 2 for each process. The film thickness of the intermediate film 82 thus formed was measured and the deposition rate was measured. As for the gas, diisopropylaminosilane was used as in the above embodiments. The graph of FIG. 18 shows the result of evaluation test 3. The vertical axis of the graph indicates the deposition rate (unit: Å/min) and the horizontal axis indicates the temperature (1000/temperature (unit: K)). The test result is plotted in the graph. For example, when the temperature is 520 degrees C., the deposition rate was 1.4 Å/min. Furthermore, an approximate straight line obtained from the respective plots is indicated in the graph. From this approximate straight line, it was confirmed that as described in the above embodiments, the higher the temperature, the higher the deposition rate.

(Evaluation Test 4)

Figure 19:
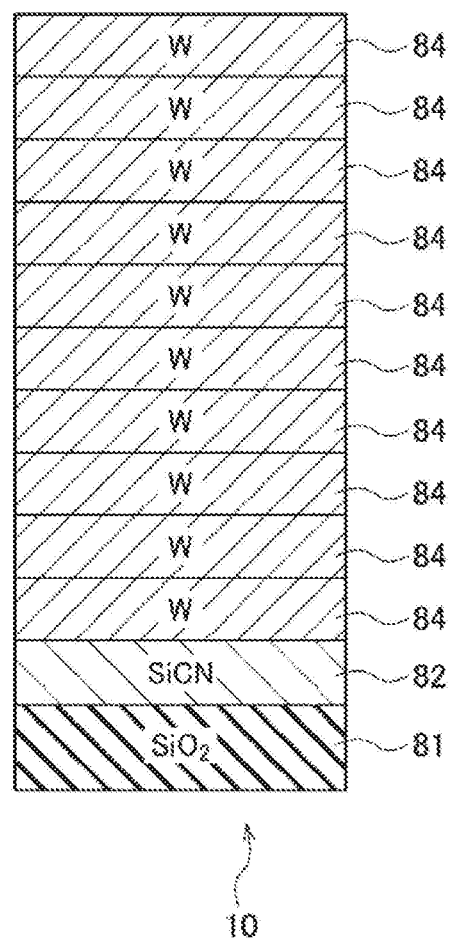
FIG. 19 is a schematic diagram of a wafer used in the evaluation test.
Figure 20:
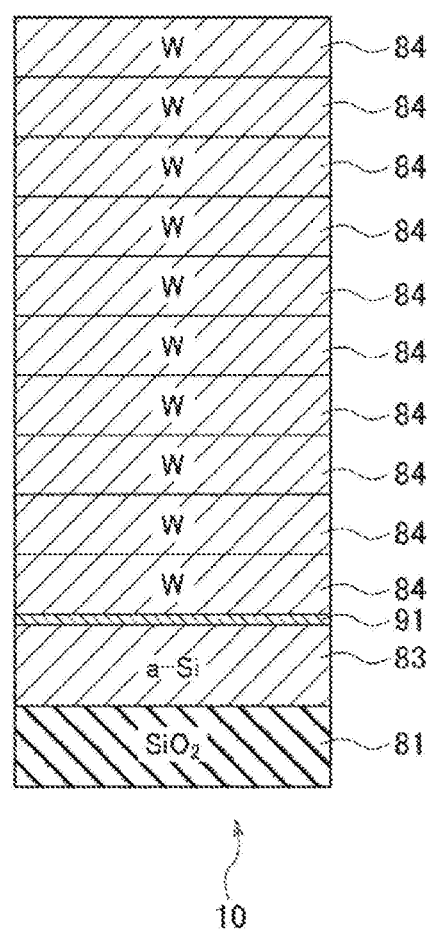
FIG. 20 is a schematic diagram of a wafer used in the evaluation test.

In evaluation test 4, the W film 84 was formed on the wafer 10 according to the first embodiment. As described with reference to FIGS. 8 and 9, steps S2 and S3 were repeatedly performed so that 10 layers of the W film 84 are laminated one above another. The film thickness of the W film 84 per layer is 225 Å. FIG. 19 is a schematic diagram of the wafer 10 of evaluation test 4. In comparative test 4, the a-Si film 83 was formed on the $SiO_2$ film 81 so as to have a film thickness of 500 Å. Thereafter, an $O_2$ gas was supplied for 5 minutes to form an oxide layer 91 on the surface of the a-Si film 83. Then, steps S2 and S3 were repeatedly performed in the same manner as in evaluation test 4 to form ten layers of the W films 84 which are laminated one above another on the oxide layer 91. The film thickness of the W film 84 per layer is 225 Å as in evaluation test 4. FIG. 20 is a schematic diagram of the wafer 10 of comparative test 4.

For each of the wafers 10 of evaluation test 4 and comparative test 4, a tape peeling test according to JIS K 5600-5-6 cross-cut method was conducted. Specifically describing this test, a test piece is prepared from the wafer 10. Using a cutter conforming to a prescribed standard, a cut of grid pattern having a predetermined size is formed on the surface of each test piece. An adhesive tape conforming to a prescribed standard is attached to a location where the cut is formed. The end of the tape is pulled in the lateral direction. Then, the state of peeling of the film is observed. In the test piece of comparative test 4, film peeling of the W film 84 occurred. However, no such film peeling occurred in evaluation test 4. Therefore, it was confirmed from the result of the evaluation test 4 that the adhesion between the W film 84 and the intermediate film 82 and the adhesion between the intermediate film 82 and the $SiO_2$ film 81 are high and further that the film peeling of the W film 84 from the $SiO_2$ film 81 can be suppressed.

According to the present disclosure in some embodiments, a first process gas is supplied onto an insulating film formed on a substrate, thereby forming an intermediate film containing silicon, carbon, nitrogen and hydrogen as main components. A second process gas is supplied to replace some of silicon constituting the intermediate film with tungsten, thereby forming a tungsten film. The tungsten film formed in this manner has high adhesion to the insulating film. It is therefore possible to suppress film peeling.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming an etching-purpose mask structure on an insulating film containing silicon and oxygen, comprising:

forming an intermediate film containing silicon, carbon, nitrogen and hydrogen as main components by supplying a first process gas onto the insulating film formed on a substrate; and subsequently, forming a tungsten film by supplying a second process gas containing a compound of tungsten to the substrate to replace some of silicon constituting the intermediate film with tungsten.

2. The method of claim 1, further comprising: after the forming an intermediate film and before the forming a tungsten film, forming a silicon film by supplying a third process gas onto the intermediate film, wherein the forming a tungsten film includes forming a tungsten film by supplying the second process gas to the silicon film to replace silicon constituting the silicon film with tungsten.

3. The method of claim 1, wherein the intermediate film contains 10 atomic % or more of carbon.

4. The method of claim 1, wherein in the intermediate film, the content of silicon is larger than the content of nitrogen.

5. The method of claim 1, wherein the first process gas is composed of a compound represented by the following chemical formula:

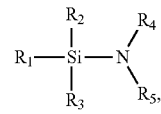

where one of $R_1$ to $R_5$ is a functional group containing carbon.

6. The method of claim 1, further comprising:

maintaining an atmosphere around the substrate in a vacuum atmosphere during a period from the start of supply of the first process gas to the substrate to the formation of the tungsten film.

7. A film forming apparatus of performing a film forming process on a substrate placed in a vacuum container, comprising:

a heating mechanism configured to heat the substrate placed in the vacuum container;

a first gas supply part configured to supply a first process gas into the vacuum container to form an intermediate film containing silicon, carbon, nitrogen and hydrogen as main components on the substrate;

a second gas supply part configured to supply a second process gas containing a compound of tungsten into the vacuum container;

a pressure regulating part configured to regulate an internal pressure of the vacuum container; and a control part configured to control the heating mechanism, the first gas supply part, the second gas supply part and the pressure regulating part so as to perform a first step of forming the intermediate film by supplying the first process gas onto an insulating film formed on the substrate and subsequently, a second step of forming a tungsten film by supplying a process gas containing a compound of tungsten to replace some of silicon constituting the intermediate film with tungsten.

* * * * *